(12) United States Patent
Wang et al.

(10) Patent No.: US 12,191,550 B2
(45) Date of Patent: Jan. 7, 2025

(54) MICROWAVE FILTER PORT SUBASSEMBLY COMPRISING A CONNECTOR WITH A PIN ATTACHED TO A CONNECTOR SEAT WHICH TURNS WITHIN A CHASSIS

(71) Applicant: Telefonaktiebolaget LM Ericsson (publ), Stockholm (SE)

(72) Inventors: Richard Wang, Ottawa (CA); Andrew McNair, Ottawa (CA); Yufeng Xu, Ottawa (CA)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 272 days.

(21) Appl. No.: 17/762,197

(22) PCT Filed: Oct. 21, 2020

(86) PCT No.: PCT/IB2020/059907
§ 371 (c)(1),
(2) Date: Mar. 21, 2022

(87) PCT Pub. No.: WO2021/079292
PCT Pub. Date: Apr. 29, 2021

(65) Prior Publication Data
US 2022/0399627 A1    Dec. 15, 2022

Related U.S. Application Data

(60) Provisional application No. 62/924,292, filed on Oct. 22, 2019.

(51) Int. Cl.
*H01P 1/04* (2006.01)
*H01P 1/207* (2006.01)
*H05K 9/00* (2006.01)

(52) U.S. Cl.
CPC .............. *H01P 1/045* (2013.01); *H01P 1/207* (2013.01); *H05K 9/0015* (2013.01); *H05K 9/0056* (2013.01)

(58) Field of Classification Search
CPC ........... H01P 1/045; H01P 5/103; H01P 1/207
(Continued)

(56) References Cited

U.S. PATENT DOCUMENTS

2015/0102873 A1* 4/2015 Wu ........................... H01P 7/04
333/203
2015/0364849 A1   12/2015 Lee et al.
(Continued)

FOREIGN PATENT DOCUMENTS

WO    2018/133335 A1    7/2018

OTHER PUBLICATIONS

International Search Report and Written Opinion dated Jan. 22, 2021 issued in PCT Application No. PCT/IB2020/059907, consisting of 12 pages.

*Primary Examiner* — Benny T Lee
(74) *Attorney, Agent, or Firm* — Weisberg I.P. Law, P.A.

(57) ABSTRACT

An apparatus for providing a connector for a microwave filter port is disclosed. According to one aspect, a subassembly includes a connector having a connector pin, a connector seat having a pass through conduit with a first opening for receiving the connector with the connector pin and a second opening at an opposite end of the pass through conduit, the connector pin protruding from the second opening when the connector is mounted to the connector seat. The subassembly further includes a coupling conductor soldered to the connector pin, where the coupling conductor is configured to be soldered to the connector pin before insertion of the subassembly into a channel of the microwave filter port.

14 Claims, 6 Drawing Sheets

(58) Field of Classification Search
USPC .......................................................... 333/202
See application file for complete search history.

(56) References Cited

U.S. PATENT DOCUMENTS

| | | |
|---|---|---|
| 2016/0254607 A1 | 9/2016 | Lee et al. |
| 2021/0098851 A1* | 4/2021 | Park et al. ............. H01R 12/91 |
| 2021/0098852 A1* | 4/2021 | Park et al. .......... H01P 1/20309 |

* cited by examiner

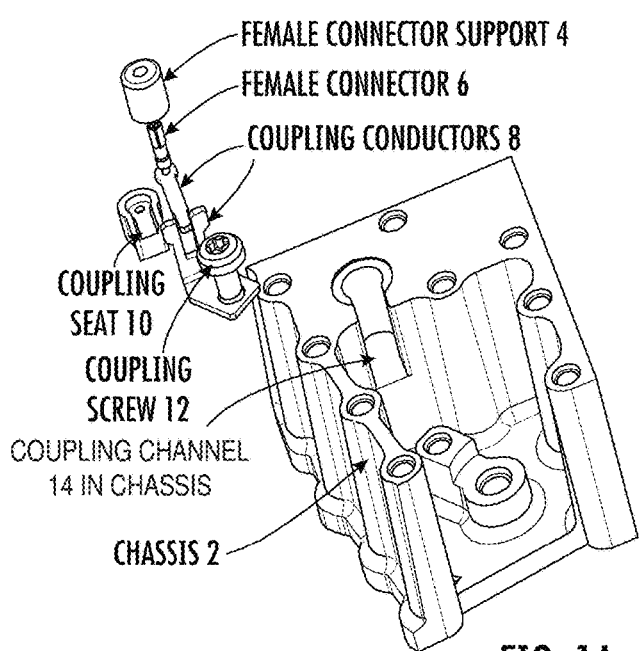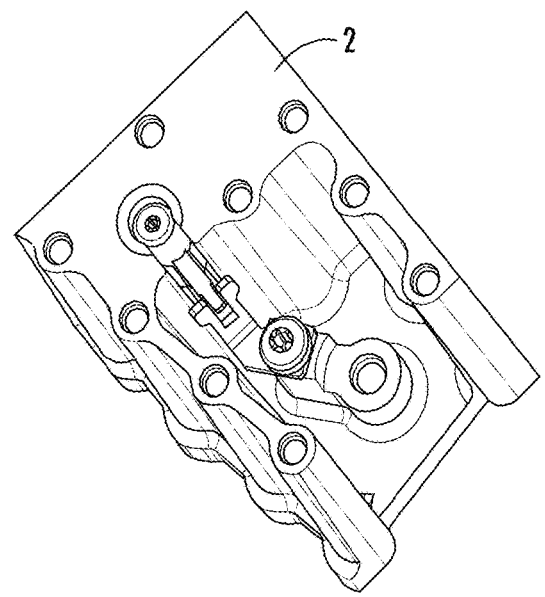
FIG. 1A (PRIOR ART)
FIG. 1B (PRIOR ART)

MICROWAVE FILTER PORT SUBASSEMBLY COMPRISING A CONNECTOR WITH A PIN ATTACHED TO A CONNECTOR SEAT WHICH TURNS WITHIN A CHASSIS

CROSS-REFERENCE TO RELATED APPLICATIONS

This application is a Submission Under 35 U.S.C. § 371 for U.S. National Stage Patent Application of International Application No.: PCT/IB2020/059907, filed Oct. 21, 2020 entitled "MICROWAVE FILTER TRANSMIT/RECEIVE CONNECTOR PORT," which claims priority to U.S. Provisional Application No. 62/924,292, filed Oct. 22, 2019, entitled "MICROWAVE FILTER TRANSMIT/RECEIVE CONNECTOR PORT," the entireties of both of which are incorporated herein by reference.

TECHNICAL FIELD

The present disclosure relates to wireless communications, and in particular, to a microwave filter transmit/receive (Tx/Rx) connector port.

BACKGROUND

Microwave air cavity filters are a typical component of radio base stations, such as found in cellular wireless communication networks. The filter unit usually includes die-cast aluminum chassis that defines the cavities and inter-cavity couplings, and a sheet metal lid that completes the encapsulation of the air cavities. The interface from the radio printed circuit board is commonly implemented with blind-mate connectors to the Tx/Rx ports of the filter unit. A coupling structure in the filter connects the Tx/Rx ports to the cavity resonators. Since air cavity filters have strong electromagnetic fields that propagate through the filters, there should be good electromagnetic isolation between the inside of the filter and the outside of the filter.

Traditionally, a microwave filter is implemented as a relatively flat, rectangular cuboid that is then later assembled into a separate radio enclosure that provides environmental protection. This allows features to be implemented on multiple sides of the filter to facilitate assembly without any requirement on ingress protection. One side of the filter may have the connectors mounted in the filter, and the opposite side of the filter may have a small access panel to allow soldering of the connector center coupling conductor to a coupling. Such a strategy allows manufacturability and good electromagnetic isolation. As recent radio evolution trends towards multi-band, multiple input multiple output (MIMO), lower power consumption, more compact structure and lighter weight, solutions are required to fit the connector and coupling structure into the filter design while still leaving as much volume for the filter cavities as possible to reduce overall filter loss. Double layer filters and radio designs that do not encapsulate the filter unit in an environmental barrier, but rather use five of the six sides of the filter unit as the radio exterior, constrain how assembly can be done, and necessitates development of a compact, robust and reliable Tx/Rx port connection solution.

A filter may have five of six sides as exterior radio surfaces. All components must be assembled into the filter from one side only. All soldering must be done from the same side, and the filter lid must cover the same side to enclose the air cavities. A typical existing solution is to have a connector mounted in the filter lid that is blind-mated to another connector inside the filter. The internal blind mate connector can be soldered to the interior of the filter, then the lid is assembled with the external blind mate connector, thus providing electromagnetic isolation. However, this solution uses multiple connectors which has a negative impact on cost, reliability, and passive intermodulation performance. Also, the accuracy of the connector position is difficult to maintain.

An example of an assembly of a conventional connector and filter lid and chassis is shown in FIGS. 1A, 1B, 2A and 2B. FIG. 1A shows a filter chassis 2 and an internal connector assembly that includes a female connector support 4, a female connector 6, coupling conductors 8, a coupling seat 10, a coupling screw 12, and a coupling channel 14 in the filter chassis 2. FIG. 1B shows the filter chassis 2 with the internal connector assembly positioned within the coupling channel 14 of the filter chassis 2. FIG. 2A shows an external connector assembly that includes a male connector 16, a connector seat 18, a gasket 20 and a filter chassis cover 21. Note that the connector seat 18 is inserted into the cover opening 21. FIG. 2B shows the external connector assembly seated in and on the filter chassis cover 21. The internal connector assembly can be soldered to the interior of the filter. Then, the filter chassis cover 21 is assembled with the external connector assembly, thus providing electromagnetic isolation. This solution uses multiple connectors which has a negative impact on cost, reliability, and passive intermodulation performance. Also, the accuracy of the connector position is difficult to maintain.

SUMMARY OF THE INVENTION

Some embodiments advantageously provide a microwave filter transmit/receive connector port.

A solution is described herein that provides a method and arrangement to precisely install a sub-assembly including a threaded connector, a threaded connector seat, and an input/output coupling into the filter chassis so that the connector and the resonator cavities are arranged and connected on the same chassis side. The connector and its seat are integrated together by threads, and then the input/output coupling is soldered onto a connector pin to become a sub-assembly. In the filter chassis, a tapped blind hole is drilled for installing the connector seat. A coupling channel is cut out in the chassis through which the coupling is configured be located. The coupling channel connects to the blind hole through a quarter of the opening of the blind hole. When the connector seat of the sub-assembly is turned into the chassis, the coupling and connector pin cannot rotate with the connector seat because the coupling and the connector pin are soldered together and guided by the coupling channel. The upper portion of the connector seat and the connector housing go through an opening in the filter cover for connection to radio connector. Finally, an electromagnetic compatibility (EMC) gasket is placed around the connector head to provide electromagnetic isolation.

According to another aspect, a microwave filter port is provided. The microwave filter port includes a cover having a cover opening, and a subassembly removably coupled to the cover opening. The subassembly includes a connector having a connector pin, a connector seat having a pass through conduit with a first opening for receiving the connector with the connector pin and a second opening at an opposite end of the pass through conduit, the connector pin protruding from the second opening when the connector is mounted to the connector seat, and a coupling conductor coupled to the connector pin. The microwave filter port also includes a chassis, the chassis having a channel configured to receive the subassembly including the coupling conductor coupled to the connector pin.

According to one aspect, in some embodiments, the connector, connector pin and coupling conductor are insertable into the connector seat such that the connector pin and coupling conductor coupled to the connector pin extend through the second opening. In some embodiments, the connector seat has threads such that the connector seat turns when mounting the subassembly to the chassis. In some embodiments, the coupling conductor is constrained by the channel from rotation. In some embodiments, the subassembly further comprises an electromagnetic compatibility gasket to electromagnetically seal the subassembly to the cover. In some embodiments, the electromagnetic compatibility gasket is affixable to a flange of the connector seat which mates with a recess in the chassis.

According to another aspect, a subassembly for a microwave filter port is provided. The subassembly is configured to be received by a channel of the microwave filter port. The subassembly includes a connector having a connector pin. The subassembly further includes a connector seat having a pass through conduit with a first opening configured to receive the connector with the connector pin and a second opening at an opposite end of the pass through conduit, the connector pin protruding from the second opening when the connector is mounted to the connector seat, and a coupling conductor coupled to the connector pin, the coupling conductor coupled to the connector pin being inserted into the channel of the microwave filter port.

According to this aspect, in some embodiments, the connector, connector pin and coupling conductor are insertable into the connector seat such that the connector pin and coupling conductor coupled to the connector pin extend through the second opening. In some embodiments, the connector seat has threads such that the connector seat turns into a chassis of the microwave filter port. In some embodiments, the subassembly is configured such that when the subassembly is inserted within the channel the coupling conductor is constrained from motion when the connector seat rotates. In some embodiments, the subassembly further comprises an electromagnetic compatibility gasket to electromagnetically seal the subassembly to the microwave filter port.

According to yet another aspect, a microwave filter port chassis is configured to receive a subassembly having a conductor connected to a conducting pin in electrical communication with an external connector. The microwave filter port chassis includes an interior channel for removably receiving and constraining the conductor connected to the conducting pin and
a cover for covering the interior channel, the cover having an opening configured to expose the external connector when the sub assembly is inserted into the microwave filter port chassis so that the conductor connected to the conducting pin is received into the interior channel.

According to this aspect, in some embodiments, the microwave filter port further includes an annular seat for receiving a flange of the external connector when the sub assembly is inserted into the microwave filter port chassis so that the conductor connected to the conducting pin is received into the interior channel. In some embodiments, the cover opening is sized to cover the flange while exposing the external connector. In some embodiments, the microwave filter port includes a threaded receiver for receiving a screw passing through an opening of the conductor when the conductor connected to the conducting pin is received into the interior channel.

According to another aspect, a microwave filter port includes a chassis configured to form an interior channel shaped to receive a conductor, a sub assembly including the conductor and an external connector, the sub assembly configured to electrically couple the conductor to the external connector, the external connector configured to electrically receive and couple a signal to an interior of the chassis by way of the conductor, and a cover configured to enclose the interior channel and a portion of the sub assembly when the conductor is received by the interior channel, the cover having an opening configured to pass a portion of the external connector through the opening.

According to this aspect, in some embodiments, the chassis is further configured with an annular seat for receiving a flange of the external connector when the sub assembly is inserted into the chassis so that the conductor is received into the interior channel. In some embodiments, the cover opening is sized to cover the flange while exposing the external connector. In some embodiments, the microwave filter port further includes an electromagnetic compatibility gasket to electromagnetically seal the sub assembly to the microwave filter port. In some embodiments, the chassis further includes a threaded receiver for receiving a screw passing through an opening of the conductor when the conductor is received into the interior channel.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein:

FIG. 1A is a drawing of an example of a conventional connector with an internal connector assembly and chassis;

FIG. 1B is a drawing of a conventional connector with the internal connector assembly in the chassis;

DETAILED DESCRIPTION OF THE INVENTION

Figures 2A, 2B:
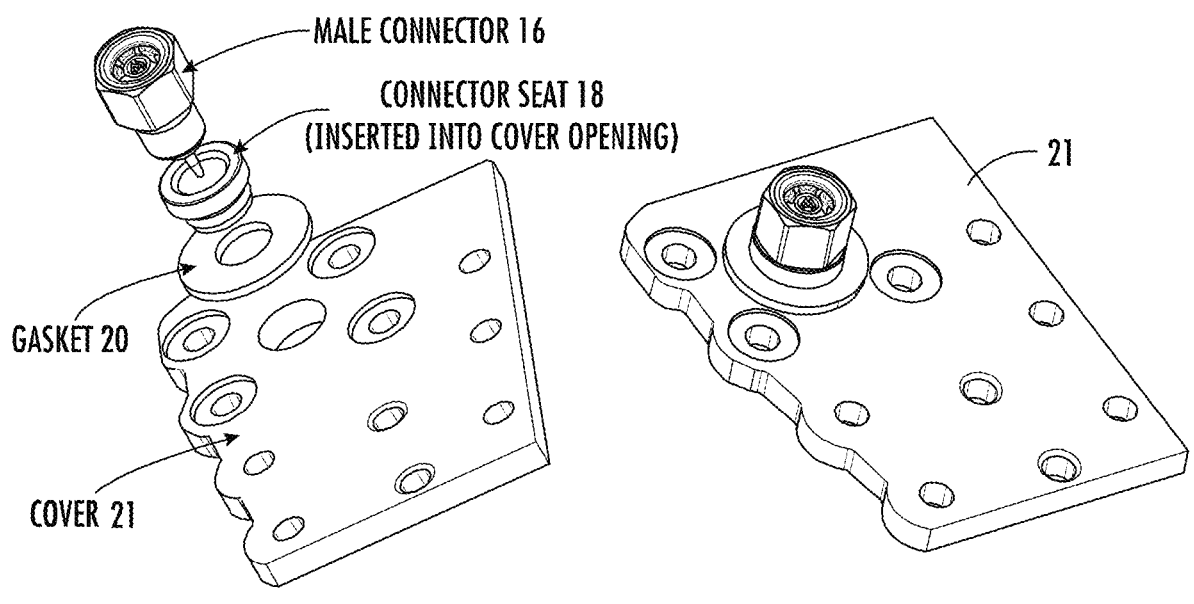
FIG. 2A is a drawing of a conventional connector with an example of an external connector assembly and a chassis cover.
FIG. 2B is a drawing of a conventional connector with the external connector mounted in the chassis cover.

Before describing in detail exemplary embodiments, it is noted that the embodiments reside primarily in combinations of apparatus components related to a transmit/receive connector port of a microwave filter. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein. Like numbers refer to like elements throughout the detailed description of the drawings.

As used herein, relational terms, such as "first" and "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

In embodiments described herein, the joining term, "in communication with" and the like, may be used to indicate electrical or data communication, which may be accomplished by physical contact, induction, electromagnetic radiation, radio signaling, infrared signaling or optical signaling, for example. One having ordinary skill in the art will appreciate that multiple components may interoperate and modifications and variations are possible of achieving the electrical and data communication.

In some embodiments described herein, the term "coupled," "connected," and the like, may be used herein to indicate a connection, although not necessarily directly, and may include wired and/or wireless connections.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments provide a microwave filter transmit/receive connector port. The connector port has a connector and a seat. As the connector and its seat are directly assembled onto filter chassis by threads, and an end of the input/output (I/O) coupling is soldered onto a connector pin via a soldering fixture, while the other end is firmly fixed to a pedestal in a chassis cavity by a screw. The solution provides an input/output port connection for the filter as an uncomplicated yet robust structure. The assembly process is likewise uncomplicated, yet provides accurate connector positions and I/O coupling position, a reliable connection and allows dismantling for repair. The embodiments provided herein also reduce part price and production cost as compared with known solutions. Also, the compact structure disclosed herein ensures more space for optimizing filter cavity layout.

Figure 3:
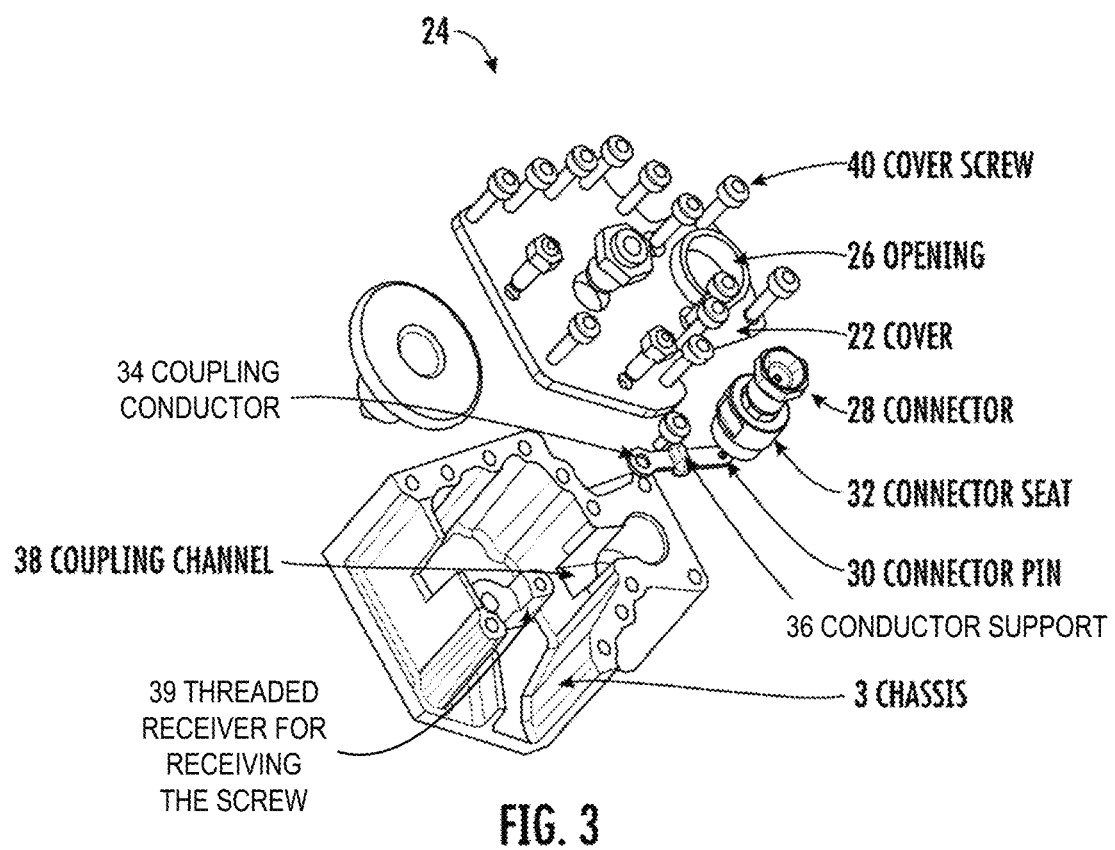
FIG. 3 is an exploded view of a microwave filter port according to principles set forth herein.

Returning now to the drawing figures, in which like elements are referred to by like reference numerals, there is shown in FIG. 3 an exploded view of a microwave filter port 24. The microwave filter port 24 has a chassis 3 which forms a cavity that is enclosed by the cover 22. The cover 22 has an opening 26 which is configured to receive a subassembly including the connector 28, a connector pin 30, connector seat 32 and coupling conductor 34. In some embodiments the coupling conductor 34 has a conductor support 36 to facilitate insertion into a coupling channel 38 of the chassis 3. The cover 22 is configured to be affixed to the chassis 3 by cover screws 40.

Figure 4:
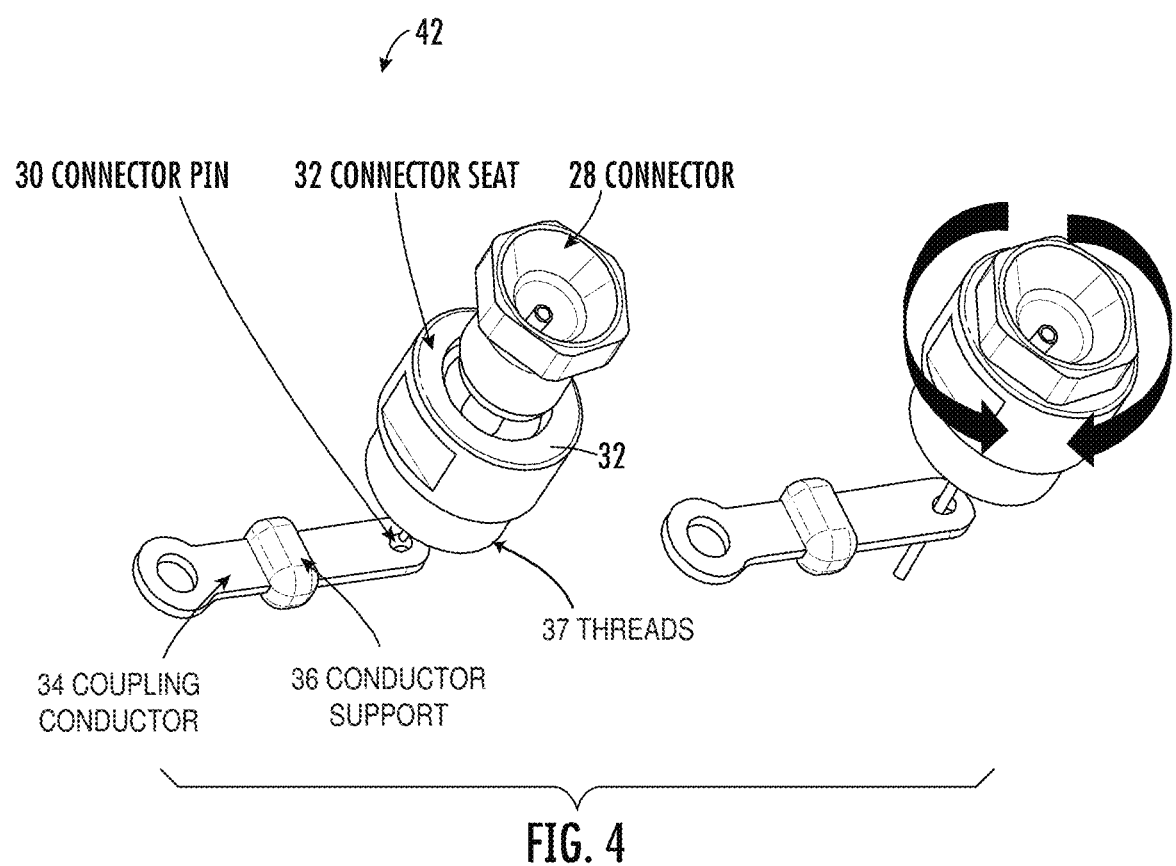
FIG. 4 is a view of a subassembly constructed in accordance with principles set forth herein.
Figure 5:
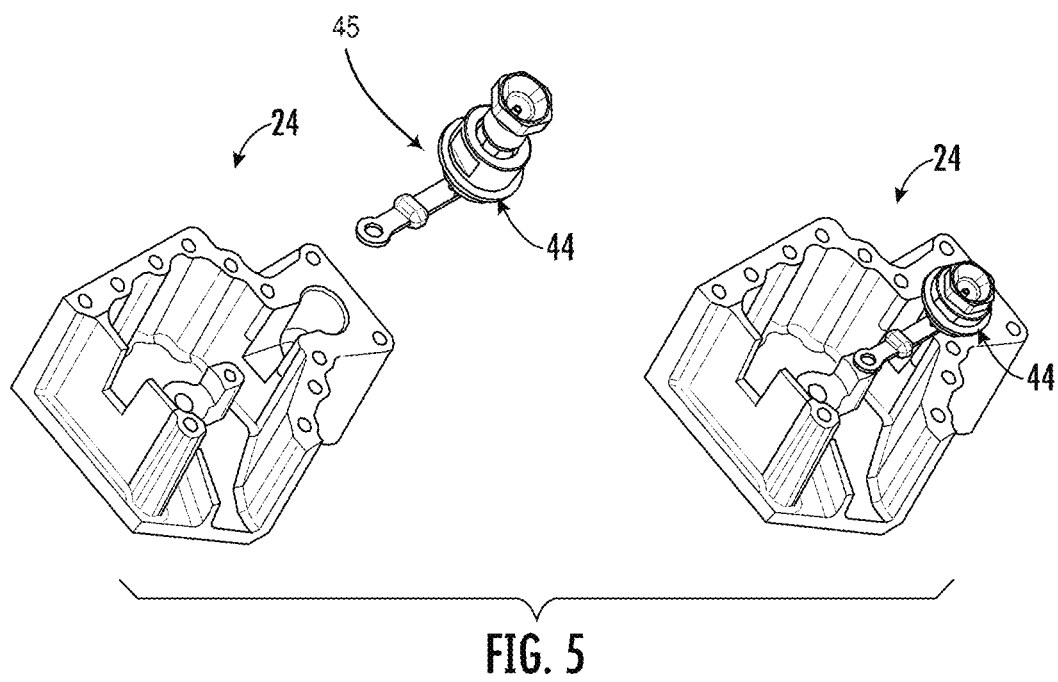
FIG. 5 is a view of the subassembly and microwave filter port constructed in accordance with principles herein.

FIG. 4 is perspective view of the subassembly shown in FIG. 3. The subassembly 42 includes a connector 28, a connector pin 30, a connector seat 32, an input/output coupling conductor 34 and a conductor support 36. The connector 28 may be pre-assembled onto its connector seat 32. The coupling conductor 34 may be pre-soldered onto the connector pin 30 of the subassembly 42 using, for example, a soldering fixture. The coupling conductor 34 may be provided with conductor support 36 which helps guide the coupling conductor 34 into the coupling channel 38. Referring to both FIGS. 3 and 4, the filter chassis 3 has a cover 22 having a tapped, i.e., threaded, opening 26 to allow installation of the subassembly 42 via the tapped connector seat 32 as shown in FIG. 3. The filter chassis 3 has the coupling channel 38 cut out in the chassis through which the coupling is configured be located. The coupling channel 38 connects to the blind hole through a quarter of the opening 26 so that the coupling conductor 34 can insert into and be guided by the coupling channel 38 as shown in FIG. 3. When the connector seat 32 is turned within the chassis 3, e.g., by threading the connector seat 32 onto complimentary threads in the chassis 3, the coupling conductor 34 is guided by its support against the wall of the coupling channel 38 and constrained from rotation. Note that the connector pin 30 (FIG. 3) is also not rotatable because there is a clearance between connector pin 30 and the connector seat 32, and the connector pin 30 has been pre-soldered onto the coupling conductor 34. The filter chassis cover 22 may be assembled on the chassis by cover screws 40 so that connector seat 32 and the head of the connector 28, which is shown as being hexagonal in FIG. 4, protrude through the opening 26 of the filter chassis cover 22. The connector seat 32 can be designed with various heights to meet specific connection height requirements when a standard connector is used. The connector seat may be designed with a flange 45 surrounding the bottom opening to enable it to be connected to, e.g., a gasket 44 as shown in FIG. 5. An EMC gasket, shown in FIG. 5 as gasket 44, may be placed on a flange 45 of the connector seat 32 (FIG. 3) and be sealed against the filter chassis cover 22 (FIG. 3) to provide electromagnetic isolation.

The connector 28 may be pre-assembled onto its connector seat 32. Then the coupling conductor 34 is soldered onto the connector pin 30 to form subassembly 42. After the coupling conductor 34 and the connector pin 30 are soldered together and guided by the coupling channel 38 in the chassis 3, the connector 28 and the connector seat 32 are still rotatable so that the subassembly 42 can be installed into or uninstalled from the tapped opening 26 in the filter chassis 3.

Figure 6:
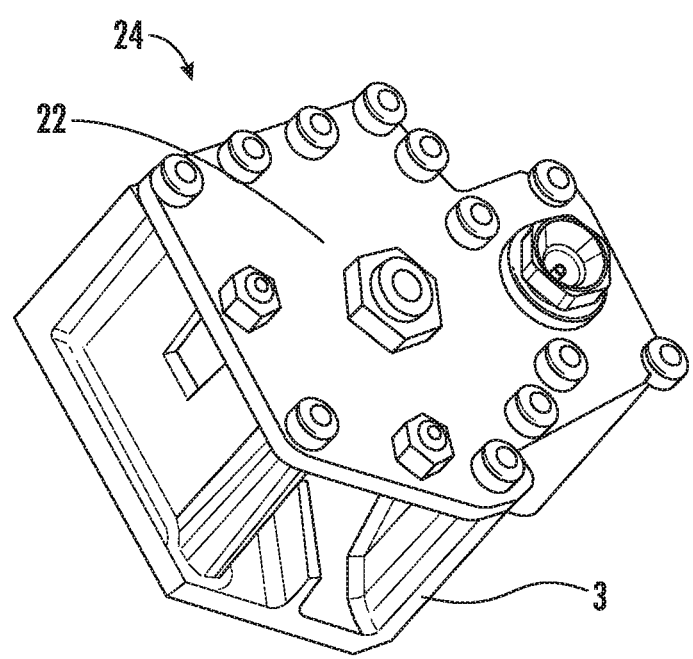
FIG. 6 is a view of the assembled microwave filter port constructed in accordance with principles herein.

In another embodiment, the connector seat 32 can include a thin flange 45 and gasket 44, as shown in FIG. 5, that is coupled to a recess in the chassis 3 to bridge the opening of the coupling channel 38. The filter cover 22 is positioned, when assembled, to cover the chassis 3 and the gasket 44 to electromagnetically seal the microwave filter port 24 as shown in FIG. 6. The connector seat 32 can be provided at various heights to meet specific height requirements for a standard connector.

FIG. 5 is a perspective view showing mating of the subassembly 42 as shown in FIG. 4 with the chassis 3 as shown in FIG. 3. FIG. 6 is a perspective view of the completed microwave filter port 24 with the subassembly 42 affixed to the chassis 3, and with the cover 22 screwed onto the chassis 3 with cover screws 40.

Thus, according to one aspect, a microwave filter port having a cover opening 26, includes a subassembly 42. The subassembly 42 is removably coupled to the cover opening 26 and includes a connector 28 having a connector pin 30 and a connector seat 32 having a pass through conduit with a first opening for receiving the connector 28 with the connector pin 30 and a second opening at an opposite end of the pass through conduit, the connector pin 30 protruding from the second opening when the connector 28 is mounted to the connector seat 32. The subassembly 42 also includes a coupling conductor 34 soldered to the connector pin 30. In this embodiment, a chassis 3 has a channel 38 configured to receive the subassembly 42 including the coupling conductor 34 coupled to the connector pin 30, thereby overcoming a problem of blind mating presented by known structures.

According to this aspect, in some embodiments, the connector 28, connector pin 30 and coupling conductor 34 are insertable into the connector seat 32 such that the connector pin 30 and coupling conductor 34 soldered to the connector pin 30 extend through the second opening. In some embodiments, the connector seat 32 has threads 37 (FIG. 4) such that the connector seat 32 turns into the cover 22 when mounting the subassembly 42 to the cover 22 and chassis 3. In some embodiments, the conductor 34 is constrained by the channel 38 from rotation. In some embodiments, the subassembly 42 further comprises an electromagnetic compatibility gasket 44 to electromagnetically seal the subassembly 42 to the cover 22. In some embodiments, the gasket 44 is affixable to a flange 45 (FIG. 5) of the connector seat 32 which mates with a recess at an upper end of the channel 38 in the chassis 3.

According to another aspect, a subassembly 42 for providing a coupling conductor 34 within a microwave filter port 24 is provided. The subassembly 42 is configured to be received by a channel 38 of the microwave filter port 24. The subassembly 42 includes a connector 28 having a connector pin 30, and a connector seat 32 having a pass through conduit with a first opening for receiving the connector 28 with the connector pin 30 and a second opening at an opposite end of the pass through conduit. In this embodiment, the connector pin 30 protrudes from the second opening when the connector 28 is mounted to the connector seat 32. The subassembly 42 also includes a coupling conductor 34 coupled to the connector pin 30, such that the coupling conductor 34 is configured to be coupled to the connector pin 30 being inserted with the subassembly 42 into a channel 38 of the microwave filter port 24.

According to this aspect, in some embodiments, the connector 28, connector pin 30 and coupling conductor 34 are insertable into the connector seat 32 such that the connector pin 30 and coupling conductor 34 soldered to the connector pin 30 extend through the second opening. In some embodiments, the connector seat 32 has threads 37 such that the connector seat 32 turns into a cover 22 of the microwave filter port 24. In some embodiments, the subassembly 42 is configured such that when mated to the microwave filter port 24, the coupling conductor 34 is constrained from motion when the connector seat 32 rotates. In some embodiments, the subassembly 42 further comprises an electromagnetic compatibility gasket 44 to electromagnetically seal the subassembly 42 to the microwave filter port 24.

According to another aspect, a microwave filter port 24 is provided. The microwave filter port 24 includes a cover having a cover opening 26, and a subassembly 42 removably coupled to the cover opening 26. The subassembly 42 includes a connector 28 having a connector pin 30, a connector seat 32 having a pass through conduit with a first opening for receiving the connector 28 with the connector pin 30 and a second opening at an opposite end of the pass through conduit, the connector pin 30 protruding from the second opening when the connector 28 is mounted to the connector seat 32, and a coupling conductor 34 coupled to the connector pin 30. The microwave filter port 24 also includes a chassis 3, the chassis 3 having a channel configured to receive the subassembly 42 including the coupling conductor 34 coupled to the connector pin 30.

According to one aspect, in some embodiments, the connector 28, connector pin 30 and coupling conductor 34 are insertable into the connector seat 32 such that the connector pin 30 and coupling conductor 34 coupled to the connector pin 30 extend through the second opening. In some embodiments, the connector seat 32 has threads 37 such that the connector seat 32 turns when mounting the subassembly 42 to the chassis 3. In some embodiments, the coupling conductor 34 is constrained by the channel from rotation. In some embodiments, the subassembly 42 further comprises an electromagnetic compatibility gasket 44 to electromagnetically seal the subassembly 42 to the cover. In some embodiments, the electromagnetic compatibility gasket 44 is affixable to a flange 45 of the connector seat 32 which mates with a recess in the chassis 3.

According to another aspect, a subassembly 42 for a microwave filter port 24 is provided. The subassembly 42 is configured to be received by a channel of the microwave filter port 24. The subassembly 42 includes a connector 28 having a connector pin 30. The subassembly 42 further includes a connector seat 32 having a pass through conduit with a first opening configured to receive the connector 28 with the connector pin 30 and a second opening at an opposite end of the pass through conduit, the connector pin 30 protruding from the second opening when the connector 28 is mounted to the connector seat 32, and a coupling conductor 34 coupled to the connector pin 30, the coupling conductor 34 coupled to the connector pin 30 being inserted into the channel of the microwave filter port 24.

According to this aspect, in some embodiments, the connector 28, connector pin 30 and coupling conductor 34 are insertable into the connector seat 32 such that the connector pin 30 and coupling conductor 34 coupled to the connector pin 30 extend through the second opening. In some embodiments, the connector seat 32 has threads such that the connector seat 32 turns into a chassis 3 of the microwave filter port 24. In some embodiments, the subassembly 42 is configured such that when the subassembly 42 is inserted into the channel the coupling conductor 34 is constrained from motion when the connector seat 32 rotates. In some embodiments, the subassembly 42 further comprises an electromagnetic compatibility gasket 44 to electromagnetically seal the subassembly 42 to the microwave filter port 24.

According to yet another aspect, a microwave filter port chassis 3 is configured to receive a subassembly 42 having a conductor connected to a conducting pin in electrical communication with an external connector. The microwave filter port chassis 3 includes an interior channel for removably receiving and constraining the conductor connected to the conducting pin and a cover for covering the interior channel, the cover having an opening 26 configured to expose the external connector when the sub assembly is inserted into the microwave filter port chassis 3 so that the conductor connected to the conducting pin is received into the interior channel.

According to this aspect, in some embodiments, the microwave filter port further includes an annular seat for receiving a flange 45 of the external connector when the sub assembly is inserted into the microwave filter port chassis 3 so that the conductor connected to the conducting pin is received into the interior channel. In some embodiments, the cover opening 26 is sized to cover the flange 45 while exposing the external connector. In some embodiments, the microwave filter port includes a threaded receiver 39 (FIG. 3) for receiving a screw passing through an opening 26 of the conductor when the conductor connected to the conducting pin is received into the interior channel.

According to another aspect, a microwave filter port includes a chassis 3 configured to form an interior channel shaped to receive a conductor, a sub assembly including the conductor and an external connector, the sub assembly configured to electrically couple the conductor to the external connector, the external connector configured to electrically receive and couple a signal to an interior of the chassis 3 by way of the conductor, and a cover configured to enclose the interior channel and a portion of the sub assembly when the conductor is received by the interior channel, the cover having an opening 26 configured to pass a portion of the external connector through the opening 26.

According to this aspect, in some embodiments, the chassis 3 is further configured with an annular seat for receiving a flange 45 of the external connector when the sub assembly is inserted into the chassis 3 so that the conductor is received into the interior channel. In some embodiments, the cover opening 26 is sized to cover the flange 45 while exposing the external connector. In some embodiments, the microwave filter port further includes an electromagnetic compatibility gasket 44 to electromagnetically seal the sub assembly to the microwave filter port. In some embodiments, the chassis 3 further includes a threaded receiver 39 for receiving a screw passing through an opening 26 of the conductor when the conductor is received into the interior channel.

Some embodiments include the following:

Embodiment A1. A microwave filter port having:
a cover having a cover opening; and
a subassembly removably coupled to the cover opening, the subassembly comprising:
  a connector having a connector pin;
  a connector seat having a pass through conduit with a first opening for receiving the connector with the connector pin and a second opening at an opposite end of the pass through conduit, the connector pin protruding from the second opening when the connector is mounted to the connector seat; and
  a coupling conductor coupled to the connector pin; and
a chassis, the chassis having a channel configured to receive the subassembly including the coupling conductor coupled to the connector pin.

Embodiment A2. The microwave filter port of Embodiment A1, wherein the connector, connector pin and coupling conductor are insertable into the connector seat such that the pin and coupling conductor coupled to the connector pin extend through the second opening.

Embodiment A3. The microwave filter port of any of Embodiments A1 and A2, wherein the connector seat has threads such that the connector seat turns into the cover when mounting the subassembly to the cover and chassis.

Embodiment A4. The microwave filter port of any of Embodiments A1-A3, wherein the coupling conductor is constrained by the channel from rotation.

Embodiment A5. The microwave filter port of any of Embodiments A1-A4, wherein the subassembly further comprises an electromagnetic compatibility gasket to electromagnetically seal the subassembly to the cover.

Embodiment A6. The microwave filter port of Embodiment A5, wherein the gasket is affixable to a flange of the connector seat which mates with a recess in the chassis.

Embodiment B1. A subassembly for a microwave filter port, the subassembly configured to be received by a channel of the microwave filter port, the subassembly comprising:
a connector having a connector pin;
a connector seat having a pass through conduit with a first opening for receiving the connector with the connector pin and a second opening at an opposite end of the pass through conduit, the connector pin protruding from the second opening when the connector is mounted to the connector seat; and
a coupling conductor coupled to the connector pin, the coupling conductor coupled to the connector pin being inserted with the subassembly into a channel of the microwave filter port.

Embodiment B2. The subassembly of Embodiment B1, wherein the connector, connector pin and coupling conductor are insertable into the connector seat such that the pin and coupling conductor coupled to the connector pin extend through the second opening.

Embodiment B3. The subassembly of any of Embodiments B1 and B2, wherein the connector seat has threads such that the connector seat turns within a cover of the microwave filter port.

Embodiment B4. The subassembly of any of Embodiments B1-B3, wherein the subassembly is configured such that when the subassembly is inserted into the channel the coupling conductor is constrained from motion when the connector seat rotates.

Embodiment B5. The subassembly of any of Embodiments B1-B4, wherein the subassembly further comprises an electromagnetic compatibility gasket to electromagnetically seal the subassembly to the microwave filter port.

It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A microwave filter port chassis configured to receive a subassembly having a conductor connected to a conducting pin in electrical communication with an external connector, the microwave filter port chassis comprising:
   an interior channel for removably receiving and constraining the subassembly;
   a cover for covering the interior channel, the cover having an opening configured to expose the external connector when the sub assembly is inserted into the microwave filter port chassis so that the conductor connected to the conducting pin is received into the interior channel;
   an annular seat for receiving a flange of the external connector when the sub assembly is inserted into the microwave filter port chassis so that the conductor connected to the conducting pin is received into the interior channel; and the cover opening being sized to cover the flange while exposing the external connector.

2. The microwave filter port chassis of claim 1, further comprising a threaded receiver for receiving a screw passing through an opening of the conductor when the conductor connected to the conducting pin is received into the interior channel.

3. A microwave filter port having:
a cover having a cover opening; and
a subassembly removably coupled to the cover opening, the subassembly comprising:
a connector having a connector pin;
a connector seat having a pass through conduit with a first opening for receiving the connector with the connector pin and a second opening at an opposite end of the pass through conduit, the connector pin protruding from the second opening when the connector is mounted to the connector seat; and
a coupling conductor coupled to the connector pin; and
a chassis, the chassis having a channel configured to receive the subassembly including the coupling conductor coupled to the connector pin, the connector seat having threads such that the connector seat turns within the chassis when mounting the subassembly to the chassis.

4. The microwave filter port of claim 3, wherein the coupling conductor is constrained by the channel from rotation.

5. The microwave filter port of claim 3, wherein the subassembly further comprises an electromagnetic compatibility gasket to electromagnetically seal the subassembly to the cover.

6. The microwave filter port of claim 5, wherein the electromagnetic compatibility gasket is affixable to a flange of the connector seat which mates with a recess in the chassis.

7. The microwave filter port of claim 3, wherein the connector and connector pin are insertable into the connector seat such that the coupling conductor coupled to the connector pin extends from the second opening.

8. A subassembly for a microwave filter port, the subassembly configured to be received by a channel of the microwave filter port, the subassembly comprising:
a connector having a connector pin;
a connector seat having a pass through conduit with a first opening configured to receive the connector with the connector pin and a second opening at an opposite end of the pass through conduit, the connector pin protruding from the second opening when the connector is mounted to the connector seat; and
a coupling conductor coupled to the connector pin, the coupling conductor coupled to the connector pin being inserted into the channel of the microwave filter port, the connector seat has threads such that the connector seat turns within a chassis of the microwave filter port.

9. The subassembly of claim 8, wherein the connector and connector pin are insertable into the connector seat such that the coupling conductor coupled to the connector pin extends from the second opening.

10. The subassembly of claim 8, wherein the subassembly is configured such that when the subassembly is inserted into the channel, the coupling conductor being constrained from motion when the connector seat rotates.

11. The subassembly of claim 8, wherein the subassembly further comprises an electromagnetic compatibility gasket to electromagnetically seal the subassembly to the microwave filter port.

12. A microwave filter port, comprising:
a chassis configured to form an interior channel shaped to receive a conductor;
a sub assembly including the conductor and an external connector, the sub assembly configured to electrically couple the conductor to the external connector, the external connector configured to electrically receive and couple a signal to an interior of the chassis by way of the conductor;
a cover configured to enclose the interior channel and a portion of the sub assembly when the conductor is received by the interior channel, the cover having an opening configured to pass a portion of the external connector through the opening;
an annular seat for receiving a flange of the external connector when the sub assembly is inserted into the chassis so that the conductor is received into the interior channel; and
the cover opening being sized to cover the flange while exposing the external connector.

13. The microwave filter port of claim 12, further comprising an electromagnetic compatibility gasket to electromagnetically seal the sub assembly to the microwave filter port.

14. The microwave filter port of claim 12, wherein the chassis further includes a threaded receiver for receiving a screw passing through an opening of the conductor when the conductor is received into the interior channel.

* * * * *